US010048311B2

(12) United States Patent
Moll et al.

(10) Patent No.: US 10,048,311 B2
(45) Date of Patent: Aug. 14, 2018

(54) DETECTION OF GATE-TO-SOURCE/DRAIN SHORTS (71) Applicant: GLOBALFOUNDRIES Inc., Grand Cayman (KY)

(72) Inventors: Hans-Peter Moll, Dresden (DE); Uwe Dersch, Dresden (DE); Ricardo Pablo Mikalo, Heideblick (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 150 days.

(21) Appl. No.: 14/848,804

(22) Filed: Sep. 9, 2015

(65) Prior Publication Data

US 2017/0067955 A1 Mar. 9, 2017

(51) Int. Cl.
*G01R 31/02* (2006.01)
*G01R 31/26* (2014.01)
*H01L 27/12* (2006.01)
*H01L 29/08* (2006.01)
*H01L 29/417* (2006.01)
*H01L 29/423* (2006.01)
*G01R 31/28* (2006.01)

(52) U.S. Cl.
CPC ...... *G01R 31/2621* (2013.01); *H01L 27/1203* (2013.01); *H01L 29/0847* (2013.01); *H01L 29/41783* (2013.01); *H01L 29/42376* (2013.01); *G01R 31/2884* (2013.01)

(58) Field of Classification Search
CPC ............... G01R 31/26; G01R 31/2642; G01R 31/2648; G01R 31/2831; G01R 31/31702; G01R 31/265; G01R 31/3012; G01R 31/318511; G01R 31/2621; G01R 31/2623; G01R 31/2625; G01R 31/2626; G01R 31/2628; G01R 31/2884; G01R 31/3004; G01R 1/0491; G01R 19/757; H01L 33/48; H01L 2933/0033; H01L 22/30
See application file for complete search history.

(56) References Cited

U.S. PATENT DOCUMENTS

| | | | | |
|---|---|---|---|---|
| 5,889,410 A | * | 3/1999 | El-Kareh | H01L 22/34 257/48 |
| 7,042,007 B2 | * | 5/2006 | Yasui | H01L 22/34 257/48 |
| 2007/0222470 A1 | * | 9/2007 | Patterson | G01R 31/311 324/754.22 |
| 2011/0193580 A1 | * | 8/2011 | League | G01R 31/40 324/750.3 |
| 2015/0198654 A1 | * | 7/2015 | Chen | G01R 31/2623 324/754.12 |
| 2017/0062438 A1 | * | 3/2017 | Moll | H01L 27/1104 |

* cited by examiner

Primary Examiner — Patrick Assouad
Assistant Examiner — Demetrius Pretlow
(74) Attorney, Agent, or Firm — Amerson Law Firm, PLLC (57) ABSTRACT A semiconductor test structure is provided for detecting raised source/drain regions-gate electrode shorts, including a semiconductor substrate, FETs formed on the semiconductor substrate, raised source/drain regions of the FETs formed on the semiconductor substrate, a gate electrode structure comprising multiple gate electrodes of the FETs arranged in parallel to each other, and a first electrical terminal electrically connected to the gate electrode structure, and wherein no electrical contacts to the raised source/drain regions are present between the multiple gate electrodes of the gate electrode structure.

16 Claims, 4 Drawing Sheets (Prior Art)

DETECTION OF GATE-TO-SOURCE/DRAIN SHORTS

BACKGROUND OF THE INVENTION

1. Field of the Invention

Generally, the present disclosure relates to the field of manufacturing of integrated circuits and semiconductor devices, and, more particularly, to the testing of transistor devices, particularly, the detecting of gate-to-source/drain shorts of transistor devices.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. Miniaturization and increase of circuit densities represent ongoing demands.

A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, on the distance between the source and drain regions, which is also referred to as channel length.

Figure 1:
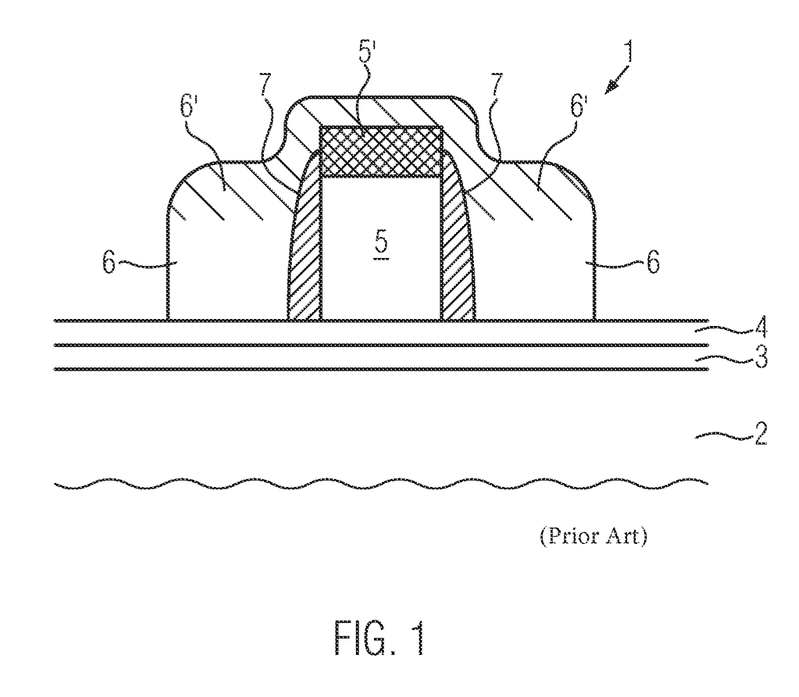
FIG. 1 shows a transistor device wherein a gate-to-raised source/drain short is unintentionally formed.

With decreasing distances of the transistor gates in the course of aggressively downscaled (Fully Depleted) SOI manufacturing, for example, in the context of the 22 nm technology, device failures due to contact-gate shorts and, in particular, gate-to-raised source/drain shorts pose severe problems. Therefore, testing semiconductor devices for such electrical shorts is of great importance. FIG. 1 shows an example of a gate-to-source/drain short in a field effect transistor (FET) 1. The FET is formed over an FDSOI substrate comprising a base substrate 2 containing silicon, a buried oxide layer 3 formed on the silicon-containing base substrate 2 and a semiconductor layer 4 comprising silicon formed on the buried oxide layer 3.

The FET 1 comprises a gate electrode 5 with a sillicided portion 5' and raised source/drain regions 6 with silicided portions 6'. As can be seen, the silicided portion 5' of the gate electrode 5 and the silicided portions 6' of the raised source/drain regions 6 merge over a sidewall spacer 7, thereby making electrical contact with each other, i.e., an electrical short (gate-to-raised source/drain short) is formed.

In the art, test structures are known that allow for detecting electrical shorts between regular contacts (CA) of source/drain regions and gates. Since the contacts are connected to raised source/drain regions, such a structure can also be used for detecting gate-to-raised source/drain shorts. However, it cannot be differentiated between CA-gate shorts and gate-to-raised source/drain shorts.

In view of the situation described above, the present disclosure provides techniques for detecting gate-to-raised source/drain shorts, in particular, detecting gate-to-raised source/drain shorts decoupled from the detection of contact-gate shorts.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to the formation of semiconductor devices comprising transistor devices, and, more particularly, to detecting faults in the formed semiconductor device, and, even more particularly, to detecting electrical shorts in FETs with raised source/drain regions.

A semiconductor test structure is provided for detecting raised source/drain regions-gate electrode shorts, with a semiconductor substrate, FETs formed on the semiconductor substrate, raised source/drain regions of the FETs formed on the semiconductor substrate, a gate electrode structure comprising multiple gate electrodes of the FETs arranged in parallel to each other, and a first electrical terminal electrically connected to the gate electrode structure. No electrical contacts to the raised source/drain regions are present between the multiple gate electrodes of the gate electrode structure. Thus, detection of raised source/drain regions-gate electrode shorts can be performed independently from any testing for contact-gate shorts.

Furthermore, a semiconductor test structure is provided for detecting raised source/drain regions-gate electrode shorts of field effect transistors (FETs), for a Fully Depleted Silicon-on-Insulator (FDSOI) substrate, with a fork-shaped gate electrode structure comprising fork arms and a fork handle, raised source/drain regions of the FETs formed on a semiconductor substrate of the FDSOI substrate, and a first electrical terminal connected to the fork handle. No electrical contacts are formed between the fork arms of the fork-shaped gate electrode structure.

Furthermore, a method for detecting failures of field effect transistors (FETs) formed on a semiconductor substrate is provided, the FETs being susceptible to electrical shorts between gate electrodes and raised source/drain regions of the FETs. The method is carried out as follows. A semiconductor test structure with field effect FETs formed on an FDSOI substrate, raised source/drain regions of the FETs formed on the FDSOI substrate and a gate electrode structure comprising multiple gate electrodes of the FETs arranged in parallel to each other is provided. No electrical contacts to the raised source/drain regions are present between the multiple gate electrodes of the gate electrode structure in the provided test structure. One of a power supply voltage and ground is applied to the gate electrode structure and the other of the power supply voltage and the ground is applied to the raised source/drain regions. Raised source/drain regions-gate electrode shorts are detected by measuring leakage currents at one of a terminal connected to the gate electrode structure and the raised source/drain regions.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the present methods are applicable to a variety of technologies, for example, NMOS, PMOS, CMOS, etc., and is readily applicable to a variety of devices, including, but not limited to, logic devices, SRAM devices, etc. Generally, testing techniques for semiconductor devices in which N-channel transistors and/or P-channel transistors may be formed are described herein. The techniques and technologies described herein can be utilized in the overall fabrication of MOS integrated circuit devices, including NMOS integrated circuit devices, PMOS integrated circuit devices, and CMOS integrated circuit devices. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

Figure 2:
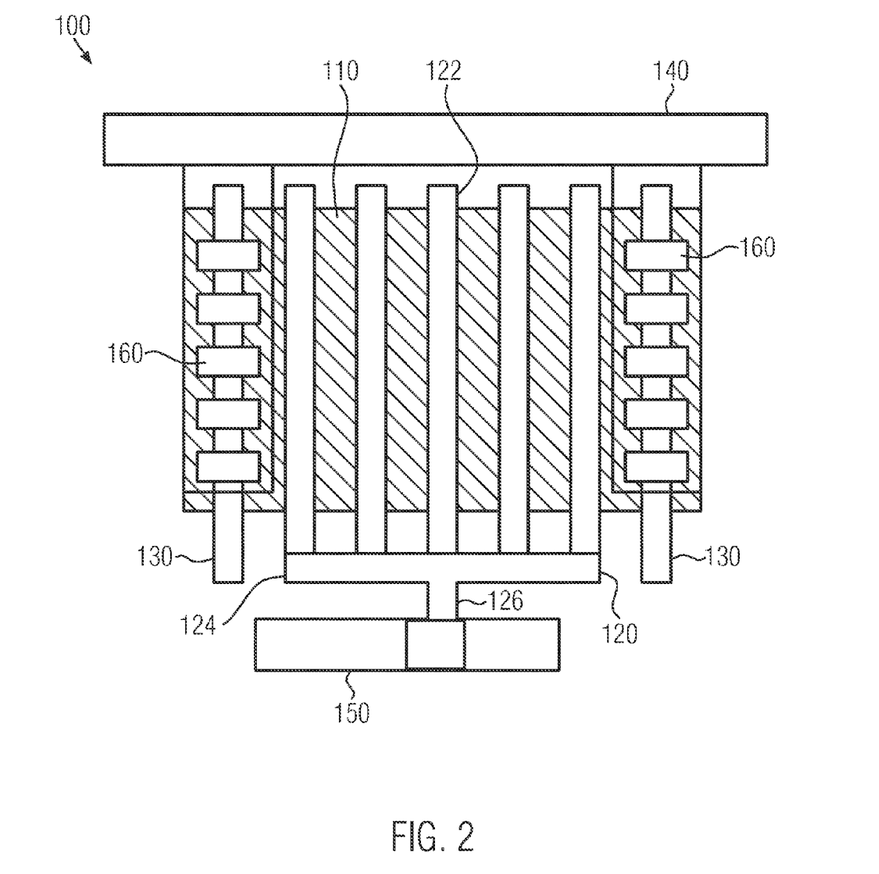
FIG. 2 illustrates an example of a test structure that has rectangular contacts landing on an active layer and is suitable for detecting gate-to-raised source/drain shorts.

FIG. 2 shows an exemplary test structure 100 comprising field effect transistors (FETs). Here, and in all other examples of the present disclosure, the FETs comprise gate electrodes that may be formed on or over gate dielectric layers. The gate electrodes may comprise metal gates. The material of the metal gates may depend on whether the transistor devices are P-channel ransistors or N-channel transistors. For N-channel transistors, the metal may include La, LaN or TiN. For P-channel transistors, the metal may include Al, AlN or TiN. The metal gate may include a work function adjusting material, for example, TiN. In particular, the metal may comprise a work function adjusting material that comprises an appropriate transition metal nitride, for example, those from Groups 4-6 in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN), and the like, with a thickness of about 1 nm to about 30 nm. Moreover, the effective work function of the metal gate can be adjusted by added impurities, for example, Al, C or F. Moreover, the gate electrodes may comprise polysilicon gates at the top of the metal gates. Sidewall spacers, for example, comprising silicon dioxide and/or silicon nitride may be formed at sidewalls of the gate electrodes. The sidewall spacers may include a plurality of spacer layers and may have widths in the range of 5-10 nm. Adjacent to the sidewall spacers, raised source/drain regions are formed.

The pitch of the gate electrodes (distances between the gate electrodes) of the TFTs may be below 120 nm and the widths of the gate electrodes may be below 30 nm, for example, 20-28 nm, and the heights of the gate electrodes may be below 60 nm, for example, 40-50 nm.

An insulating layer that is planarized by chemical mechanical polishing may be formed over the TFTs. Holes may be etched in the planarized insulating layer over gate electrodes as well as source/drain regions. The holes may be filled by some contact material for allowing electrically contacting the gate electrodes and the source/drain regions.

The test structure 100 comprises a semiconductor layer 110 providing an active layer. In fact, the semiconductor layer 110 comprises channel regions of the FETs. As already mentioned, raised source/drain regions are formed on the semiconductor layer 110 adjacent to the channel regions. The raised source/drain regions may be epitaxially grown on the semiconductor layer 110 and may have heights of ½ to ⅚, for example, about ⅔, of the heights of the gate electrodes. Particularly, the raised source/drain regions may have heights of below 45 nm. Both the semiconductor layer 110 and the raised source/drain regions may comprise silicon. The raised source/drain regions may be formed by epitaxially growing an SiGe material. Over the channel regions, gate electrodes of a gate electrode structure 120 are formed. The gate electrode structure 120 is formed in a fork shape. The fork arms (prongs) 122 of the fork shape form gate electrodes. The fork arms 122 are connected to each other at one end by a bar element 124. A fork handle 126 is connected to the bar element 124 at a side of the same that is opposed to the side where it connects the fork arms 122.

On the left and right hand sides of the fork arms 122, dummy gates 130 are provided that are not part of the gate electrode structure 120. Provision of the dummy gates 130 avoids, during the lithographic manufacturing process, aberrations due to diffraction at the outermost fork arms 122 of the gate electrode structure 120, i.e., the provision of the dummy gates 130 guarantees a continuous poly pitch of all fork arms of the gate electrode structure 120. Rectangular contacts 160 are formed over parts of the dummy gates 130 and the semiconductor layer 110 for contacting raised source/drain regions. Thereby, the raised source/drain regions are connected to a first terminal 140. The series of rectangular contacts 160 provides for a low contact resistance. The partial landing of the rectangular contacts 160 on the semiconductor layer 110 allows for a safe distance of the contacts to the gate electrodes (fork arms) 122, thereby eliminating a risk of contact-gate shorts. It is noted that the test structure 100 may show a minimal pitch (distance) of the gate electrodes 122 that do not allow for placing regular contacts for electrically contacting the raised source/drain regions without a high risk of contact-gate electrode shorts. Contrary to the rectangular contacts, the regular contacts have no portion formed over a gate (dummy gate). No regular contacts (in fact, no contacts at all) are formed between individual gate electrodes 122 of the fork-shaped gate electrode structure 120. The fork handle 126 is connected to a second terminal 150 at an end opposite to the one at which it is connected to the bar element 124.

The test structure 100 may comprise N-channel FETs and/or P-channel FETs and it is suitable for detecting source/drain regions-gate electrode shorts. The test structure 100 may comprise SOI, in particular, Fully Depleted SOI (FDSOI) FETs. The FETs may be formed on an (FD)SOI semiconductor substrate. Here, and in all other examples described, the semiconductor substrate may comprise a bulk semiconductor substrate wherein insulation regions, for example, shallow trench insulations, are formed. The bulk semiconductor substrate may be a silicon substrate, in particular, a single crystal silicon substrate. Other materials may be used to form the semiconductor substrate such as, for example, germanium, silicon germanium, gallium phosphate, gallium arsenide, etc. The insulation regions may define active regions and electrically isolate the FETs from other active or passive devices formed on the same SOI substrate. The insulation regions may be parts of a contiguous trench isolation structure and may be formed by etching the bulk semiconductor substrate and filling the formed trenches with some dielectric material, for example, silicon oxide.

An insulation/buried oxide layer may be formed on the bulk semiconductor substrate and below the semiconductor layer 110. The buried oxide layer may include a dielectric material, such as silicon dioxide, and may be an ultra-thin buried oxide (UT-BOX) having a thickness in a range from about 10-20 nm. The semiconductor layer may be formed on the buried oxide layer. The semiconductor layer provides the channel region of the FETs and may be comprised of any appropriate semiconductor material, such as silicon, silicon/germanium, silicon/carbon, other II-VI or III-V semiconductor compounds and the like. The semiconductor layer may have a thickness suitable for forming a fully depleted example, a thickness in a range from about 5-8 nm.

The test structure 100 is suitable for detecting raised source/drain regions-gate electrode shorts. By the fork-shaped gate electrode structure 120, the lengths of the individual gate electrodes 122 are extended in order to increase a rate of detection of relatively small source/drain regions-gate electrode shorts. These source/drain regions-gate electrode shorts may be detected by measuring (relatively small) leakage currents. It is noted that any leakage measurement to the bulk substrate is not possible in the SOI configurations under consideration.

In the test structure 100 shown in FIG. 2 for testing N-channel FETs, the first terminal 140 is connected to ground and a power supply voltage $V_{DD}$ is applied to the second terminal 150 to open the gates of the N-channel FETs. For the detection of the source/drain regions-gate electrode shorts, the current at the second terminal 150 is measured. In the test structure 100 shown in FIG. 2 for testing P-channel FETs, a power supply voltage $V_{DD}$ is applied to the first terminal 140 and the second terminal 150 is connected to ground to open the gates of the P-channel FETs. Accordingly, for the detection of the raised source/drain regions-gate electrode shorts, the current at the first terminal 140 is measured.

Figure 3:
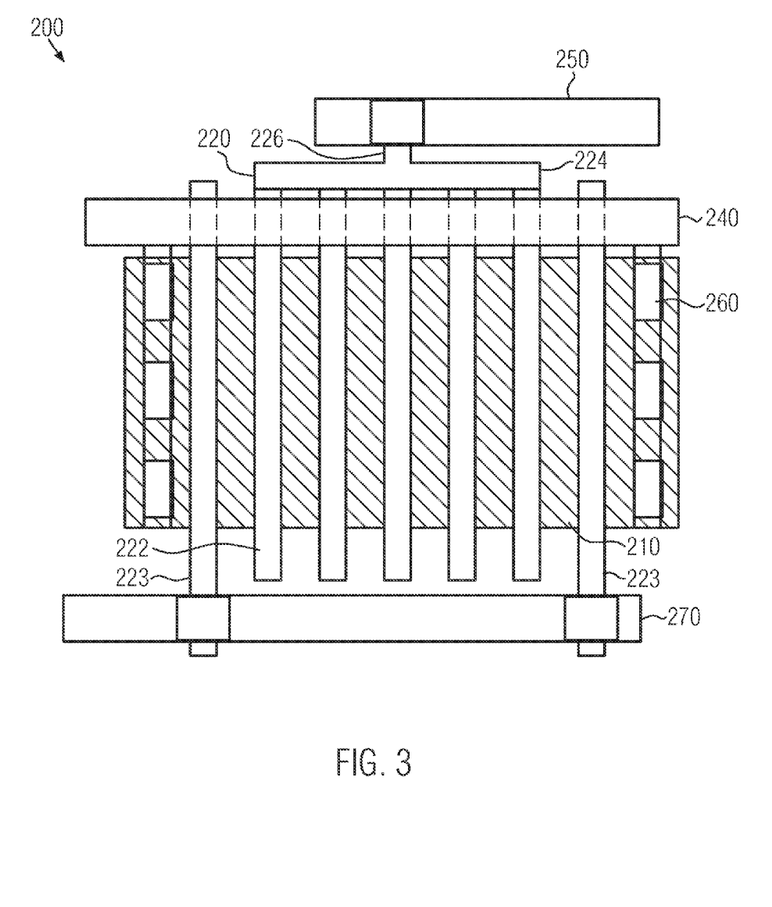
FIG. 3 illustrates an example of a test structure that has regular contacts landing on an active layer and is suitable for detecting gate-to-raised source/drain shorts.

FIG. 3 illustrates another exemplary test structure 200. The test structure 200 comprises FETs. The FETs may be formed on an (FD)SOI semiconductor substrate. The test structure comprises a semiconductor layer 210 providing an active layer, in particular, channel regions of the FETs. Raised source/drain regions are formed adjacent to the channel regions. Similar to the example shown in FIG. 2, a fork-shaped gate electrode structure 220 is provided. The fork-shaped gate electrode structure 220 comprises parallel fork arms 222 connected by a bar element 224 that in turn is connected to a fork handle 226.

Different from the example shown in FIG. 2, regular contacts 260 are formed for contacting the raised source/drain regions. The regular contacts 260 are connected to a first terminal 240. A second terminal 250 is connected to the fork handle 226 of the fork-shaped gate electrode structure 220. Due to the provision of the regular contacts, for a relatively small pitch of the gate electrodes 222, there is a risk of contact-gate electrode shorts, in principle. However, in the test structure 200 shown in FIG. 3, outermost gate electrodes 223 are connected to a third terminal 270 rather than the second terminal 250. In other words, the outermost gate electrodes 223 closest to the regular contacts 260 are connected to a different voltage network than the gate electrodes 222 of the fork-shaped gate electrode structure 220. Consequently, contact-gate electrode shorts will not affect detection of raised source/drain regions-gate electrode shorts.

In the test structure 200 shown in FIG. 3 for testing N-channel FETs, the first terminal 240 is connected to ground and a power supply voltage $V_{DD}$ is applied to the second terminal 250 to open the gates of the N-channel FETs. For the detection of the source/drain regions-gate electrode shorts, the current at the second terminal 250 is measured. In the test structure 200 shown in FIG. 3 for testing P-channel FETs, a power supply voltage $V_{DD}$ is applied to the first terminal 240 and the second terminal 250 is connected to ground to open the gates of the P-channel FETs. Accordingly, for the detection of the raised source/drain regions-gate electrode shorts, the current at the first terminal 240 is measured.

In the examples described above with reference to FIGS. 2 and 3, test structures 100 and 200 were used for static failure detection by measuring leakage currents for a uniformly applied potential to the active regions of the semiconductor layers 110 and 210, respectively. However, dynamic measurements may also be envisaged.

For example, detection failures of N-channel FETs comprised in the test structure 200 of FIG. 3 may be realized by the following three subsequently performed steps. First, the source/drain regions are connected to ground by connecting the first terminal 240 to ground and simultaneously a power supply voltage is applied to both the terminal 250 connected to the gate structure 220 and the terminal 270 connected to the outermost gate electrodes 223. The gates are opened by this first step. In the next step, the second terminal 270 is switched to ground. Terminal 250 may be retained connected to $V_{DD}$.

Thereby, the gates are closed and, depending on the presence of raised source/drain-gate shorts, the active regions of the FETs will float to $V_{DD}$. As a third step, after having waited for some time in order to allow for the floating process to be completed, the gates are opened again by switching the second terminal 250 and the other terminal 270 to $V_{DD}$ and the potential of the active regions of the TFTs can be probed again. This dynamic procedure may result in a more accurate determination of the severity of raised source/drain-gate shorts as compared to the previously described static measurement procedure.

Figure 4:
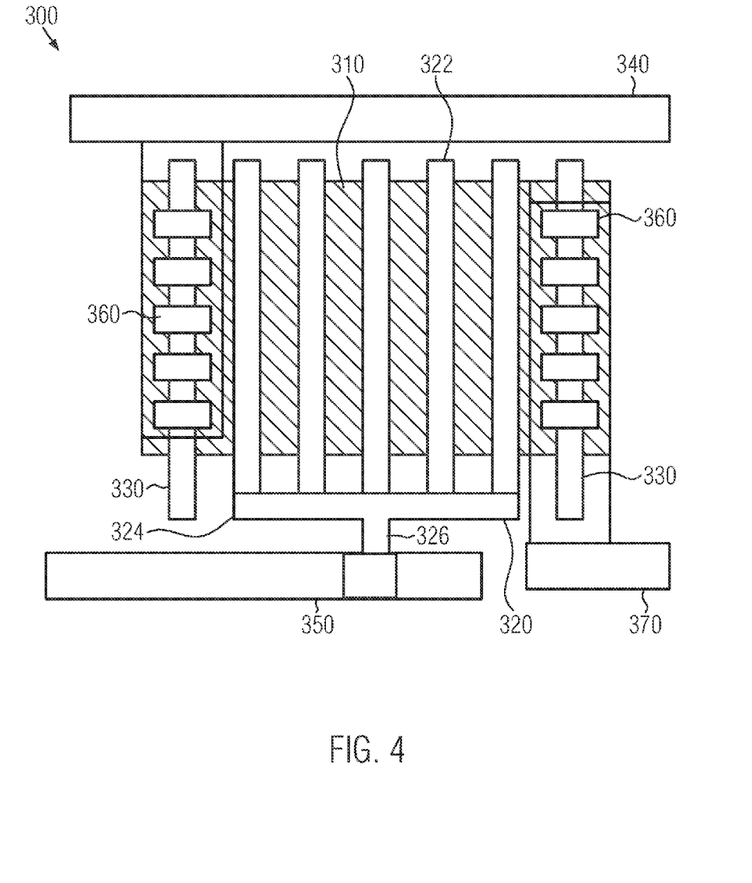
FIG. 4 illustrates a test structure similar to the one shown in FIG. 2 but with the option of the application of an asymmetric potential to the active layer.

Another example of a test structure 300 with FETs for detecting raised source/drain regions-gate electrode shorts is illustrated in FIG. 4. The FETs may be formed on an (FD)SOI semiconductor substrate. The test structure 300 comprises a semiconductor layer 310 providing an active layer. In fact, the semiconductor layer 310 comprises channel regions of the FETs. Moreover, the raised source/drain regions are formed on the semiconductor layer 310 adjacent to the channel regions. The raised source/drain regions may have been epitaxially grown on the semiconductor layer 310. Both the semiconductor layer 310 and the raised source/drain regions may comprise silicon. The raised source/drain regions may be formed by epitaxially growing an SiGe material. Over the channel regions, gate electrodes of a gate electrode structure 320 are formed in a fork shape. The fork arms (prongs) 322 of the fork form gate electrodes.

The fork arms 322 are connected to each other at one end by a bar element 324. A fork handle 326 is connected to the bar element 324 at a side of the same that is opposed to the side where it connects the fork arms 322.

On the left and right hand sides of the fork arms, dummy gates 330 are provided. Rectangular contacts 360 are formed over parts of the dummy gates 330 and the semiconductor layer 310. The series of rectangular contacts 360 provides for a low contact resistance. Similar to the example shown in FIG. 2, the partial landing of the rectangular contacts 360 on the source/drain regions of the semiconductor layer 310 allows for a safe distance of the contacts to the gate electrodes (fork arms) 322, thereby eliminating a risk of contact-gate shorts. No regular contacts are formed between individual gate electrodes 322 of the fork-shaped gate electrode structure 320.

Different from the example shown in FIG. 2, the rectangular contacts 360 on the left-hand side and on the right-hand side of the test structure 300 are not necessarily connected to the same potential. Rather, the left ones of the rectangular contacts 360 are connected to a first terminal 340 (see top of FIG. 4) and the right ones of the rectangular contacts 360 are connected to a different terminal 370 (see bottom of FIG. 4). The fork handle 326 is connected to a second terminal 350 at an end opposite to the one at which it is connected to the bar element 324 (see bottom of FIG. 4).

Due to the connection of the left ones of the rectangular contacts 360 to one terminal 340 and the right ones of the rectangular contacts 360 to another terminal 370, an asymmetric potential can be applied to the source/drain regions of the semiconductor layer 310. This allows for a more differentiated diagnosis as compared to the symmetric potential configuration illustrated in FIG. 2. For example, for N-channel FETs, the gates are opened by applying a power supply voltage $V_{DD}$ to the second terminal 350. For the detection of failures due to raised source/drain regions-gate electrode shorts, the two other terminals 340 and 370 may be connected to ground or the first terminal 340 may be connected to ground and the voltage $V_{DD}$ may be applied to the other terminal 370 or vice versa. If, in all three cases, the measured leakage currents are low, it is determined that (almost) no raised source/drain regions-gate electrode shorts are present. If, in all three cases, the measured leakage currents are high, it is determined that massive raised source/drain regions-gate electrode shorts are present. Currents are measured at the second terminal 350. For the detection of raised source/drain regions-gate electrode shorts of P-channel TFTs, the applied voltages have to be appropriately changed (confer description of FIG. 2).

If for a detection mode in that the first terminal 340 is connected to ground and $V_{DD}$ is applied to the other terminal 370 a lower leakage current is determined than in the case where the other terminal 370 is connected to ground and $V_{DD}$ is applied to the first terminal 340, it is determined that a raised source/drain regions-gate electrode short is present on the right-hand side of the test structure 300. On the other hand, if for a detection mode in that the other terminal 370 is connected to ground and $V_{DD}$ is applied to the first terminal 340 a lower leakage current is determined than in the case where the first terminal 340 is connected to ground and $V_{DD}$ is applied to the other terminal 370, it is determined that a raised source/drain regions-gate electrode short is present on the left-hand side of the test structure 300.

It is noted that an asymmetric potential can also be applied to a test structure shown in FIG. 3 modified by providing two different electrical terminals rather than a common terminal 240 connected to the regular contacts on the left-hand side and right-hand side of the fork-shaped gate electrode structure 220, respectively.

As a result test structures and methods for detecting raised source/drain regions-gate electrode shorts are provided that are decoupled from the conventional detection of contact-gate shorts and allow for a reliable failure detection both in the context of static and dynamic measurements of leakage currents.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor test structure for detecting raised source/drain regions-gate electrode shorts, comprising:
    a semiconductor substrate;
    field effect transistors (FETs) formed on said semiconductor substrate;
    raised source/drain regions of said FETs formed on said semiconductor substrate;
    a gate electrode structure comprising multiple gate electrodes of said FETs arranged in parallel to each other;
    a first electrical terminal electrically connected to said gate electrode structure;
    dummy gates outside of said gate electrode structure and arranged adjacent to and parallel to outermost gate electrodes of said gate electrode structure;
    rectangular contacts formed adjacent said dummy gates and contacting said raised source/drain regions; and
    a second electrical terminal electrically connected to said rectangular contacts;
    and wherein no electrical contacts to said raised source/drain regions are present between said multiple gate electrodes of said gate electrode structure.

2. The semiconductor test structure of claim 1, wherein said semiconductor substrate is a Fully Depleted Silicon-on-Insulator (FDSOI) substrate.

3. The semiconductor test structure of claim 1, wherein said raised source/drain regions are formed on a semiconductor layer of said semiconductor substrate.

4. The semiconductor test structure of claim 1, wherein said gate electrode structure is fork-shaped.

5. The semiconductor test structure of claim 1, wherein:
    said dummy gates comprise:
        a first dummy gate outside of said gate electrode structure and arranged adjacent to and parallel to a first outermost gate electrode of said gate electrode structure; and
        a second dummy gate outside of said gate electrode structure and arranged adjacent to and parallel to a second outermost gate electrode of said gate electrode structure;
    wherein said rectangular contacts comprise first rectangular contacts formed partially over said first dummy gate and contacting a first subset of said raised source/drain regions, and second rectangular contacts formed partially over said second dummy gate and contacting a second subset of said raised source/drain regions;
    wherein said second electrical terminal is electrically connected to said first rectangular contacts; and
    the semiconductor test structure further comprises a third electrical terminal electrically connected to said second rectangular contacts.

6. A semiconductor test structure for detecting raised source/drain regions-gate electrode shorts of field effect transistors (FETS) for a Fully Depleted Silicon-on-Insulator (FDSOI) substrate, comprising:
    a fork-shaped gate electrode structure comprising fork arms and a fork handle;
    raised source/drain regions of said FETs formed on a semiconductor substrate of said FDSOI substrate; and
    a first electrical terminal connected to said fork handle;
    a first dummy gate outside of said fork-shaped gate electrode structure and arranged adjacent to and parallel to a first outermost fork arm of said fork-shaped gate electrode structure;
    a second dummy gate outside of said fork-shaped gate electrode structure and arranged adjacent to and parallel to a second outermost fork arm of said fork-shaped gate electrode structure;
    first rectangular contacts formed adjacent said first dummy gate and contacting a first subset of said raised source/drain regions; and
    second rectangular contacts formed adjacent said second dummy gate and contacting a second subset of said raised source/drain regions;
    and wherein no electrical contacts are formed between said fork arms of said fork-shaped gate electrode structure.

7. The semiconductor test structure of claim 6, further comprising a second electrical terminal electrically connected to said first and second rectangular contacts.

8. The semiconductor test structure of claim 6, further comprising a second electrical terminal electrically connected to said first rectangular contacts and a third electrical terminal electrically connected to said second rectangular contacts.

9. A method for detecting failures of field effect transistors (FETs) formed on a semiconductor substrate, said FETs being susceptible to electrical shorts between gate electrodes and raised source/drain regions of said FETs, the method comprising:
    providing a semiconductor test structure with FETs formed on a Fully Depleted Silicon-on-Insulator (FDSOI) substrate, raised source/drain regions of said FETs formed on said FDSOI substrate and a gate electrode structure comprising multiple gate electrodes of said FETs arranged in parallel to each other and without electrical contacts to said raised source/drain regions being present between said multiple gate electrodes of said gate electrode structure;
    applying one of a power supply voltage and ground to said gate electrode structure and the other of said power supply voltage and said ground to said raised source/drain regions; and measuring leakage currents at one of a terminal connected to said gate electrode structure and said raised source/drain regions.

10. The method of claim 9, wherein said gate electrode structure is fork-shaped.

11. The method of claim 9, wherein said provided test structure comprises rectangular contacts to said source/drain regions positioned outside of said gate electrode structure, and the method further comprises applying one of said power supply voltage and said ground to said rectangular contacts.

12. The method of claim 9, wherein said provided test structure comprises dummy gates positioned outside of said gate electrode structure and rectangular contacts partially formed over said dummy gates and contacting said raised source/drain regions, and the method further comprises applying one of said power supply voltage and said ground to said rectangular contacts.

13. The semiconductor device test structure of claim 1, wherein said rectangular contacts at least partially overlap said dummy gates.

14. The semiconductor device test structure of claim 1, wherein said rectangular contacts do not overlap said dummy gates.

15. The semiconductor device test structure of claim 6, wherein said first and second rectangular contacts do not overlap said first and second dummy gates, respectively.

16. The semiconductor device test structure of claim 6, wherein said first and second rectangular contacts at least partially overlap said first and second dummy gates, respectively.

* * * * *

UNITED STATES PATENT AND TRADEMARK OFFICE
CERTIFICATE OF CORRECTION

PATENT NO. : 10,048,311 B2
APPLICATION NO. : 14/848804
DATED : August 14, 2018
INVENTOR(S) : Moll et al.

Page 1 of 1

It is certified that error appears in the above-identified patent and that said Letters Patent is hereby corrected as shown below:

In the Claims

Column 11, Line 19 (Claim 13, Line 1), after "semiconductor" delete "device".

Column 11, Line 22 (Claim 14, Line 1), after "semiconductor" delete "device".

Column 11, Line 25 (Claim 15, Line 1), after "semiconductor" delete "device".

Column 11, Line 28 (Claim 16, Line 1), after "semiconductor" delete "device".

Signed and Sealed this
Second Day of October, 2018

Andrei Iancu
*Director of the United States Patent and Trademark Office*